(12) United States Patent
Dempsey

(10) Patent No.: US 7,453,384 B2
(45) Date of Patent: Nov. 18, 2008

(54) DIGITAL TO ANALOG CONVERTER (DAC) CIRCUIT WITH EXTENDED OPERATION RANGE

(75) Inventor: Dennis A. Dempsey, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/707,215

(22) Filed: Feb. 14, 2007

(65) Prior Publication Data

US 2008/0191915 A1   Aug. 14, 2008

(51) Int. Cl.
*H03M 1/66* (2006.01)
(52) U.S. Cl. ...................... 341/144; 341/120
(58) Field of Classification Search ............... 341/144, 341/141, 139, 143, 118, 120; 330/2, 10, 330/297; 323/282
See application file for complete search history.

(56) References Cited

U.S. PATENT DOCUMENTS

| | | | |
|---|---|---|---|
| 5,652,542 A * | 7/1997 | Fink | 330/2 |
| 6,538,346 B2 * | 3/2003 | Pidutti et al. | 307/127 |
| 6,614,310 B2 * | 9/2003 | Quarfoot et al. | 330/297 |
| 6,933,710 B2 * | 8/2005 | Shieh | 323/282 |
| 6,982,593 B2 * | 1/2006 | Robinson et al. | 330/10 |
| 6,987,851 B1 * | 1/2006 | Toumani et al. | 379/399.01 |
| 7,031,457 B2 * | 4/2006 | Melsa | 379/399.01 |

* cited by examiner

*Primary Examiner*—Peguy JeanPierre
(74) *Attorney, Agent, or Firm*—Wolf, Greenfield & Sacks P.C.

(57) ABSTRACT

A DAC circuit is described which includes a DAC coupled to an amplifier. The circuit is configured to dynamically change the operating range of the amplifier depending on the circuit operating requirements. In this way the DAC circuit may be operable in one of a plurality of available ranges so as to have an extended range of operation.

35 Claims, 5 Drawing Sheets

# DIGITAL TO ANALOG CONVERTER (DAC) CIRCUIT WITH EXTENDED OPERATION RANGE

FIELD OF THE INVENTION

The present invention relates to digital to analog converter (DAC) circuits and particularly to a DAC circuit with an extended range providing a wide output operating range. The invention more particularly relates to a DAC circuit which dynamically modifies a supply voltage to an output stage of an amplifier. Circuits in accordance with the teaching of the invention are particularly suited for applications requiring increased integration and increased power density. Such circuitry is particularly useful where low power requirements are preferred such as in mobile telecommunications or battery powered applications. The teaching of the invention enables a modification of the operating range of the circuitry as required by operating conditions.

BACKGROUND

Moore's law provides a roadmap for a continued doubling of the density of integrated circuits every 18 months. With increased density, the size of the actual components becomes smaller. In the case of a transistor, the dimensions across the transistor regions become smaller, with the result that the electric field intensity gets higher. With the increase in density the operating voltages which can be used across small junction regions of the devices reduces. However there is still a desire for devices to have wide operating voltage ranges.

There is therefore a conflict between the need to operate devices at low voltages and to enable the devices to operate over a wide voltage range. There is therefore a need for a circuit that enables devices which are operable at low voltages to be used in extended range operation.

There is a further need for circuits that are configured to be operable in greater power efficiency modes.

SUMMARY

These needs and others are addressed by a Digital to Analog converter (DAC) circuit which provides at its output a wide operating range yet functions in low voltage conditions and consumes low power. In accordance with the teaching of a first embodiment, the circuit includes a DAC coupled at its output to an amplifier, the circuit additionally including control circuitry digitally coupled to the input to the DAC and providing an analog input to the amplifier and configured to modify a supply voltage to the amplifier based on the input to the DAC so as to change an operating range or span of the amplifier to correspond with the output of the DAC. In this way the circuit is configured to dynamically change the operation range of the amplifier to correspond to the operating requirements of the circuit. It will be understood that by changing the operating range of the amplifier output stage, that the circuit output may be tuned to vary its range of operation as required. In this way the physical constraints of individual components of the circuit which may otherwise limit the range of the circuit to be within a range are addressed by a modification of the parameters defining that range so as to vary the location of the range as required. In this way the circuit may be operable over a wider operating range. By using DAC input data, a circuit configured in accordance with the teachings of the invention may modify the output of the circuit to enable it operate over a different range depending on the requirements of operation.

It will be appreciated that the control circuitry may be provided in one or more configurations including switches, drive amplifiers or a mixed signal control loop. Further examples of the type of circuitry that may be utilised include digital control circuitry.

These and other features will be better understood with reference to exemplary embodiments.

BRIEF DESCRIPTION OF THE DRAWINGS

The present invention will now be described with reference to the accompanying drawings in which.

DETAILED DESCRIPTION OF THE DRAWINGS

The invention will now be described with reference to exemplary embodiments thereof which are not to be considered as limiting in any fashion. Circuits in accordance with the teachings of the invention are described below with reference to specific figures but it will be understood that components and architectures described with reference to a first figure may equally be applied in the context of the architecture of a second figure. Furthermore, certain embodiments are described in the context of bipolar or unipolar environments. These environments represent voltage levels which are respectively located on either side of ground reference or are only located on one side of the ground reference respectively. Within this context the terms Vdd and Vss are used in their conventional meaning as will be well known to the person skilled in the art as representing the upper and lower bipolar supply levels respectively. The term Vdd can be considered as the name for the positive unipolar supply the term Vss the equivalent negative unipolar supply. Furthermore, within the context of the present invention it will be understood that one or multiple reference supplies or supply variants may be utilised. Although conventional bipolar supply levels are considered as being selectable from one of +/−15V, +/−12V, +/−10V, +/−5V, +/−3.3V, +/−3V, +/−2.5V and unipolar supply levels of 5V, 3.3V, 3V, 2.5V and down to <1V are considered very useful in the context of the present invention, the techniques of the invention may be equally applied in high unipolar applications such as those implemented at 200V, 100V . . . 20V. Therefore, while the techniques of the present invention are applicable with such voltage supplies and are described with reference to specific exemplary implementations, it is not intended to be limited in any way except as may be deemed necessary in the light of the appended claims. Any application which requires extension of the normal operation range may benefit from circuitry according to the teaching of the invention.

Figure 1:
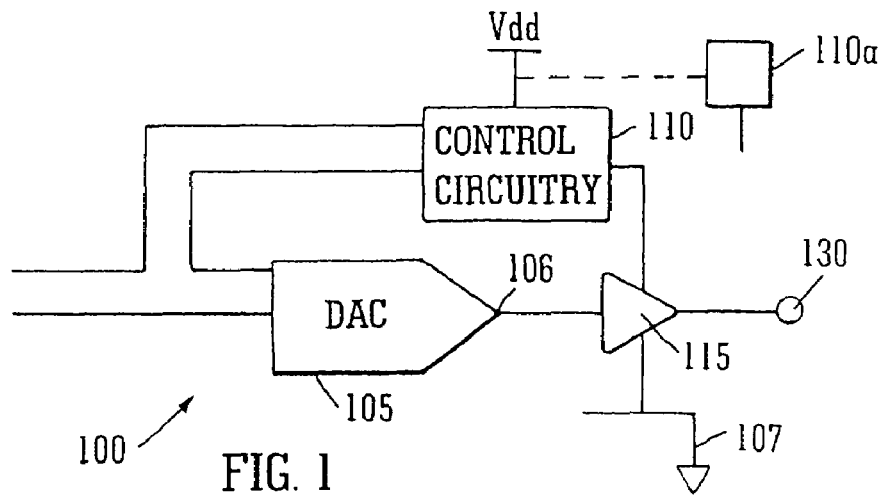
FIG. 1 is a schematic showing a circuit in accordance with the teachings of the invention.

As shown in the schematic of FIG. 1, which describes a unipolar arrangement, a circuit in accordance with the teaching of the invention includes a DAC 105, which is coupled at its output to an amplifier 115. A supply voltage terminal of the amplifier is coupled to a ground reference 107 and a second supply terminal is coupled to control circuitry 110 which is also digitally coupled to the DAC input. The control circuitry 110 is configured to control or regulate the supply voltage to the amplifier based on the input to the DAC so as to change the operating range of the amplifier to correspond with the output of the DAC. The control circuitry may be configured to provide linear control for example by using a DAC arrangement or may be configured to provide voltage regulation using for example a voltage regulator in the form of for example a boost regulator or other power supply regulator. Using a linear arrangement is useful in modifying the dynamic range of the output of the amplifier in a linear, low-noise fashion whereas a switched-mode power voltage regulator has applications in improving the power efficiency of the circuit, as will be discussed below. Certain applications may utilise both linear and switch-mode regulators as will be evident from the following discussion. Optionally an additional control block 110a may be provided to sense fluctuations in the supply Vdd and to provide for a corresponding change in the operation of the amplifier.

Figure 2:
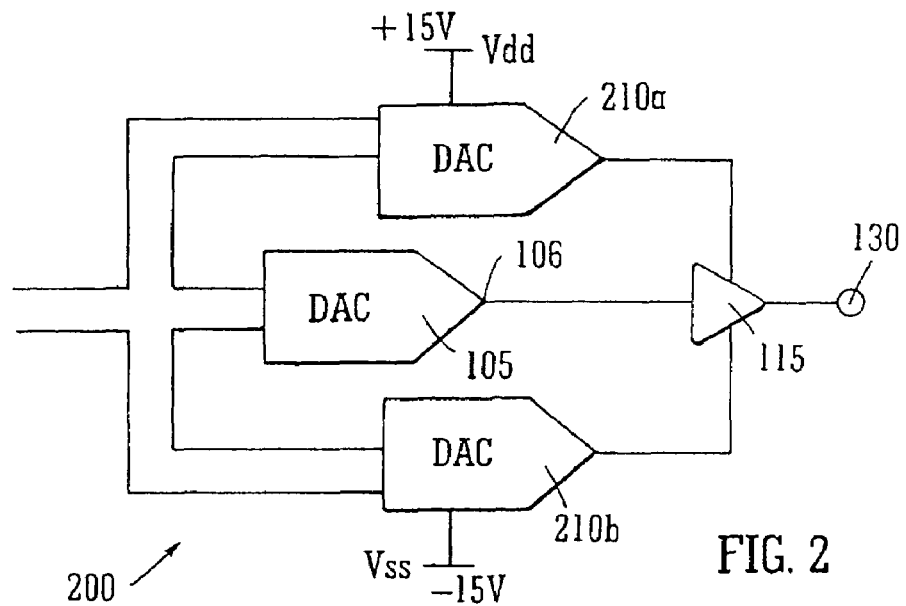
FIG. 2 is a schematic showing a modification of the circuit of FIG. 1 to provide for bipolar control of the output stage of the amplifier.

FIG. 2 shows an example of a bipolar arrangement of the circuit of FIG. 1, implemented using linear DACs coupled to both the positive and negative supplies to the amplifier. The same reference numerals will be used for equivalent parts. In this embodiment, and similarly to FIG. 1, a digital to analog converter (DAC) circuit 200 is provided which is configured to provide at its output 130 a wide operating range yet functions in low voltage conditions. In accordance with the teachings of the invention, the circuit includes a DAC 105 coupled at its output 106 to an amplifier 115. The circuit additionally includes control circuitry, provided in the form of buffer DACs 210a, 210b coupling the input of the DAC and the amplifier and configured to modify the supply voltage to the amplifier based on the input to the DAC so as to change the operating range of the amplifier to be moved as appropriate to the requirements of the circuit operation. Such movement can cater for a movement across ranges in a sensible fashion and can also be configured to cater for transients across ranges. In this way the circuit is configured to dynamically change its output to correspond to the operating requirements. It will be understood that by changing the operating range of the amplifier, that the circuit output may be tuned to one or more specific ranges of operation so as to appear to have a wide operating range. By using DAC input data, a circuit configured in accordance with the teachings of the invention may modify the output of the circuit to enable it operate over a different range depending on the requirements of operation.

It will be appreciated that the control circuitry may be provided in one or more configurations. As shown in FIG. 2, two buffer DAC components 210a, 210b are provided, each being responsible for the positive and negative supply voltages respectively. By activating one or other of the DAC components, it is possible to modify the voltage supplied to the amplifier 115 so as to reduce it from the available voltage supply, which in the case of the example of FIG. 2 has a maximum possible value of +15V or in the negative range, −15V. In this way the operating range of the amplifier may be tailored to suit the operating requirements of the circuit so as to appear to have a larger range than individual devices making up the circuit are physically capable of having.

Figure 3:
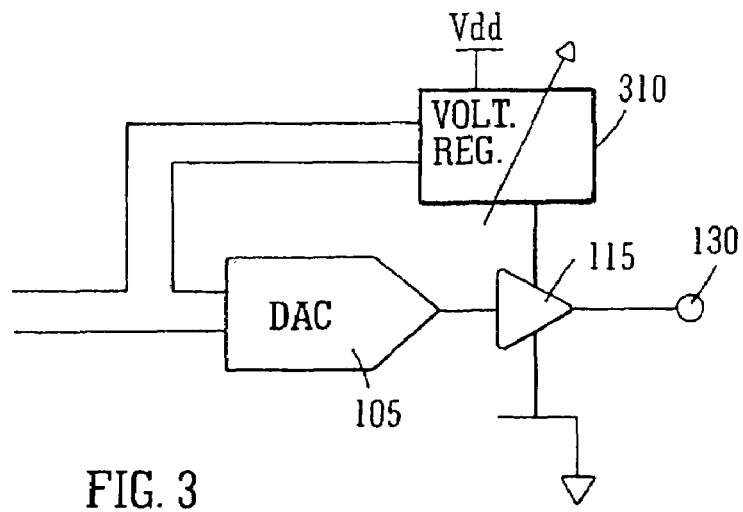
FIG. 3 shows in schematic form another circuit in accordance with the teachings of the invention wherein a switch regulator is used to provide for control of the amplifier.

FIG. 3 shows a further modification, showing the control of the positive power supply of the amplifier, where the control circuitry is provided as a voltage regulator 310. By providing a voltage regulator, which could for example be a boost regulator or alternate switch-mode power supply regulator, it is possible to drop, or increase, the voltage supplied to the amplifier 115, and in particular to the output stage of the amplifier, in a gradual manner. By reducing the range of voltages applied to the output stage of the amplifier, it will be appreciated that the power dissipation at the output stage is reduced. Using the example of a 5V device, it is feasible to reduce the power requirements by greater than 50%. Such power savings will however depend on a number of different factors as will be appreciated by the person skilled in the art.

Figure 4:
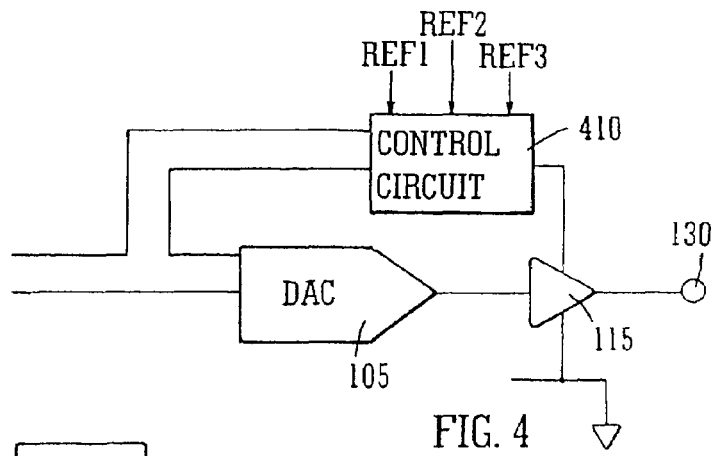
FIG. 4 shows another circuit in accordance with the teachings of the invention providing a plurality of reference levels.

Heretofore, the control circuitry has been described with reference to control of a single reference voltage. It is possible, and is provided within the context of the present invention, to provide for a control using multiple supplies. As shown in the example of FIG. 4, three reference supplies Ref1, Ref2 and Ref3, are coupled to the control circuit 410. Depending on the output of the DAC 105 as fed to the amplifier 115, the control circuitry can selectively couple one of the available reference supplies to the amplifier 115. By varying the regulator in a judicious fashion it is possible to achieve power efficiencies.

Figure 5:
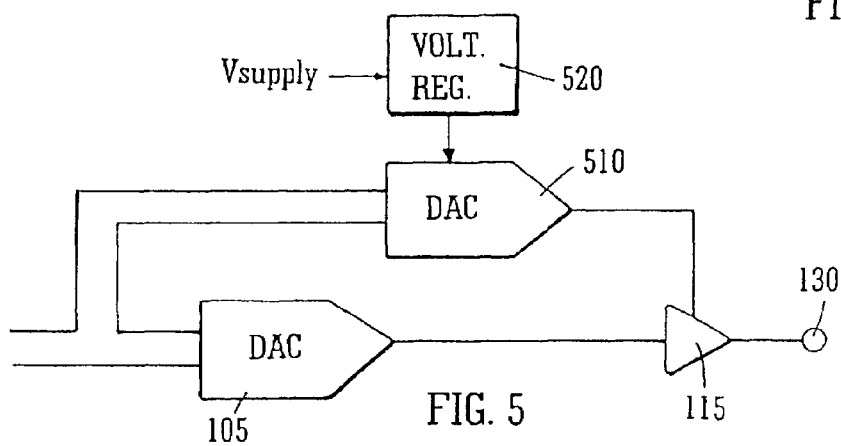
FIG. 5 shows a further modification wherein a linear control and a switch control are combined to control the supply voltages to the amplifier.

FIG. 5 shows a further modification to the circuits heretofore described, where a combination of a voltage regulator 520 and a linear control DAC 510 are used to tune the supply voltage of the amplifier. From this it will be understood that within the context of the present invention any arrangement of control circuitry that provides for a change to the supply voltage of the output stage of an amplifier which is coupled to a DAC 105 is possible. By coupling such a voltage regulator 520 to the DAC 510 it is possible to effectively mimic the arrangement of multiple supplies previously described in FIG. 4, without having to provide such supplies individually.

What has been described heretofore are arrangements of control circuitry implemented using DC linear control and/or regulated control in the context of single or multiple supplies arranged in either a unipolar or bipolar configurations. Other components that could be used for the control circuitry include switches, amplifiers or a mixed signal control loop.

Figure 6:
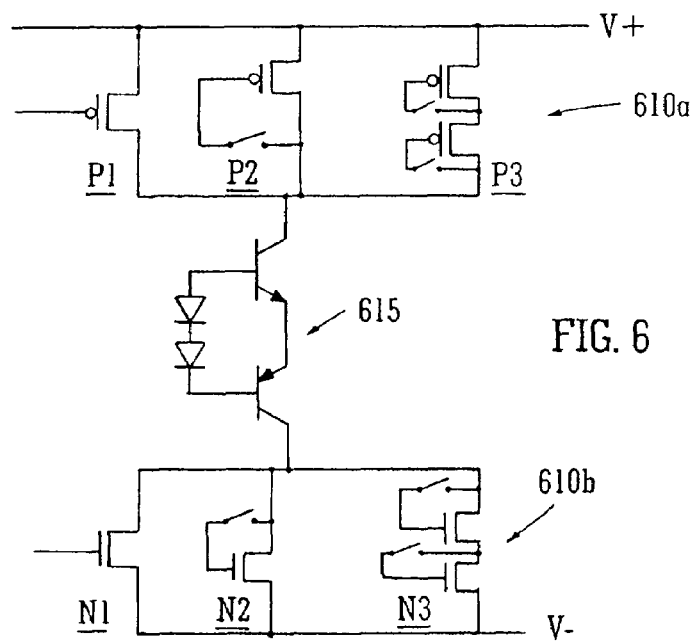
FIG. 6 shows in more detail examples of control circuitry coupled to an output stage of the amplifier.

As shown in FIG. 6, each of the control circuits may be provided as a set of components defining a variable voltage supply. For the sake of simplicity only exemplary components that typically define an output stage 615 of the amplifier are shown. In the example of FIG. 6, three positive legs P1, P2 & P3 (610a) and three negative legs N1, N2 & N3 (610b) are provided between the respective positive, V+, and negative, V−, voltage rails. (It will be seen from an examination of FIG. 6 that P3 is formed from two components P3a and P3b, and correspondingly N3 is formed from two components N3a, N3b, but the specifics of such implementations will be apparent to the person skilled in the art). By providing individual MOS switches and using these to switch one or more of the individual legs it is possible to vary the voltage seen by the output stage 615 of the amplifier and so tailor its region of operation, as will be evident from Table 1 which illustrates an exemplary mode of operation of these switches.

TABLE 1

|    | Low | Medium | High |
|----|-----|--------|------|
| P1 | Off | Off    | On   |
| P2 | Off | On     | Off  |
| P3 | On  | Off    | Off  |
| N1 | On  | Off    | Off  |
| N2 | Off | On     | Off  |
| N3 | Off | Off    | On   |

For example, for low output mode operation, P3 & N1 are switched on and all others are switched off. For mid-region operation P2 & N2 are on and all other devices are off. For high output operation, P1 & N3 is on and all other devices are off. It will therefore be apparent using exemplary values, that a 20V isolated device can use this architecture at 30 V(Vdd-Vss) with significant overlap of the output stage operation range. It will be understood that the span of the 20V device is within the range of the architecture (30V) and that by using the techniques of the invention that it is possible to move the span to overlap with the range so as to effectively control the extension of the span. It will be appreciated by the person skilled in the art that where the switch configuration provides for the lowest value to be the dominant path, that the higher valued devices could be switched on without affecting the intended route through the circuitry—for the ease of explanation such permutations are not provided in the above description of operation.

It will be understood that the schematic of FIG. 6, showing the switchable voltage dividers will be usefully implemented using digital control logic but for the sake of convenience such components are not illustrated.

Figure 7A:
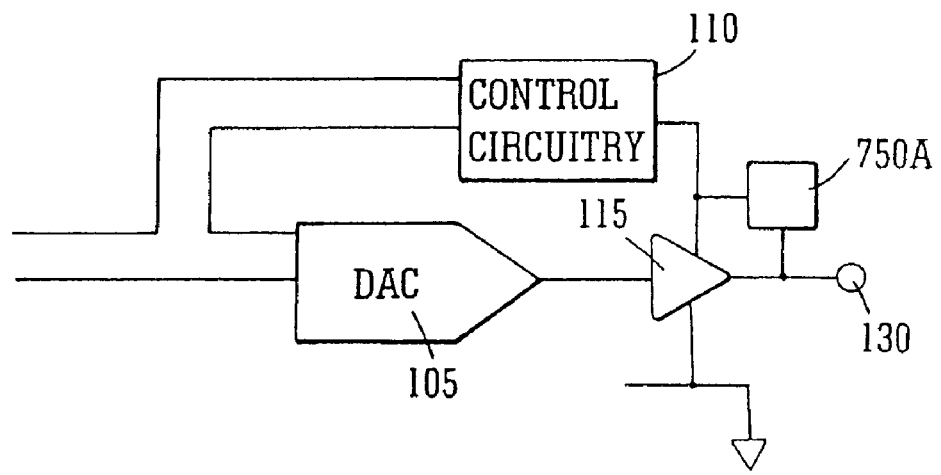
FIG. 7 shows in schematic block form an example of a sensing device that may be used to compensate for abuse events at the output of the amplifier.
Figure 7B:
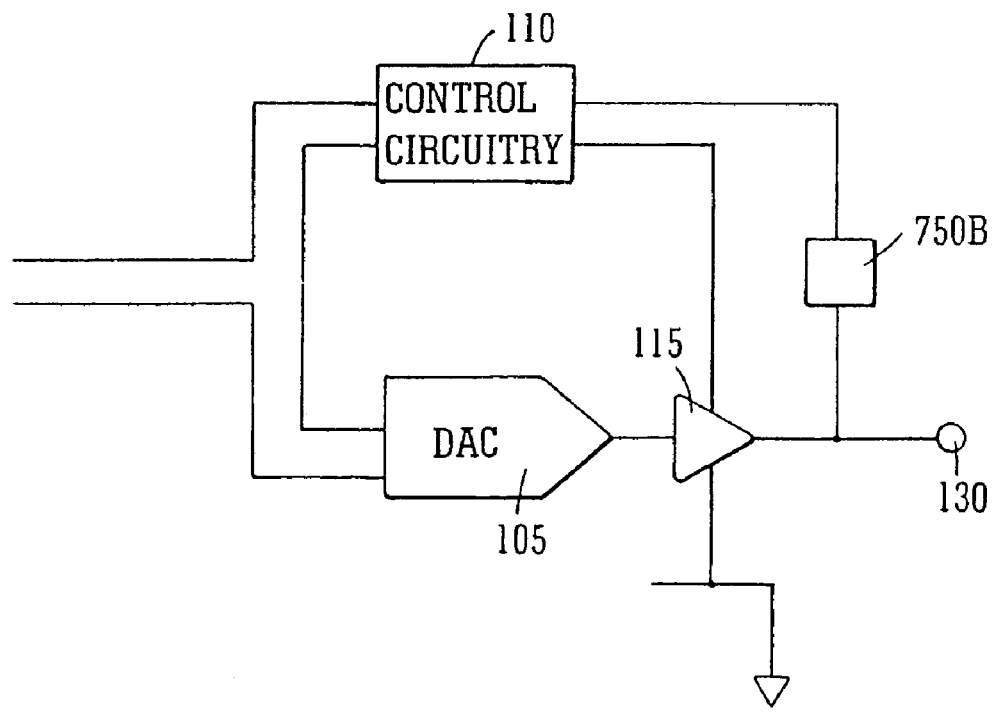

It will be understood that in addition to providing an extended range of operation that the circuit of the present invention, as it is includes an amplifier operating in a closed loop arrangement serves to substantially maintain the desired output level at the output 130 of the circuit, even in the presence of output stage power supply variations—thereby providing good power supply rejection ratio. The circuit can also be configured to cater for abuse events such as short circuit conditions to for example the ground, signal or power supply lines. Another example of an abuse condition is a situation where a large load switching transient is sensed at the output which could cause the output to change significantly. In the example of FIG. 7a, a monitoring or control device 750a, such as a Zener diode or indeed a specific monitoring circuit, may be coupled to the output node and also to one of the input legs that control the supply voltage to the output stage of the amplifier. In this arrangement, any load that is present on the output and which could cause a failure is immediately sensed by the monitoring device which serves to modify the supply voltage to the amplifier to compensate for that transient. This arrangement, a small loop configuration, is naturally fast and therefore is particularly advantageous in embodiments where speed of reaction is paramount. In a modification to this arrangement, shown in FIG. 7b, the monitoring or control functionality is used to provide a control feed to the control block 110. In this arrangement, a monitoring or control device 750b is used to provide a sensing function which is then used as an input to the control block 110 which effects the necessary action. In this arrangement the monitoring device 750b may be provided as a stand-alone component, as shown in FIG. 7b, or may be incorporated into the control block 110. Effectively, the arrangements of FIG. 7 enable a sensing of the output of the circuit and provide for control of the circuit based on the behaviour at the output as well as at the input. Such an arrangement is especially advantageous where the circuit is driving an unknown load, where it is possible for example for abuse events to occur, and can be used to adapt to variations at the output node 130.

Figure 8:
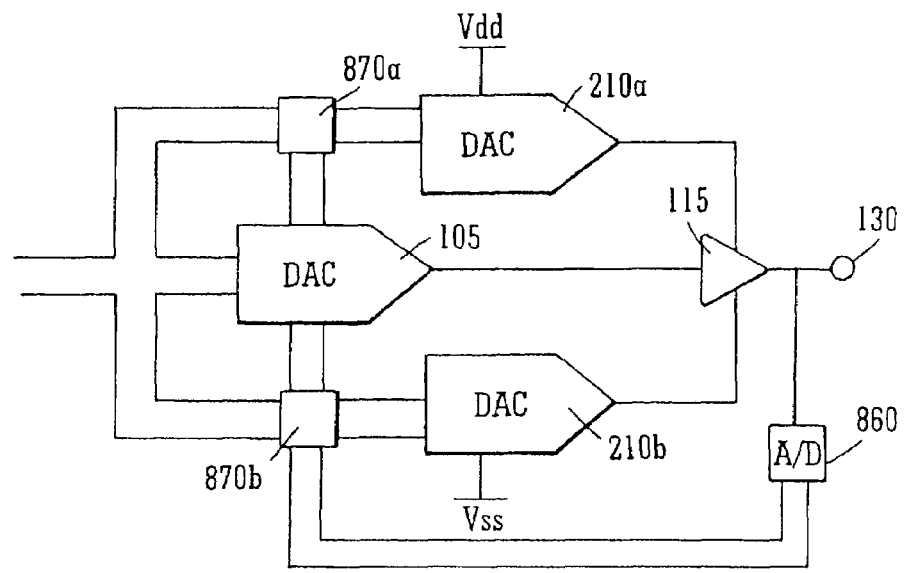
FIG. 8 shows in schematic block form another example of a compensating circuit configured to provide for voltage monitoring.

Alternative arrangements that may be used to provide a dynamic circuit which can be used for voltage monitoring include that shown in FIG. 8. In this embodiment, an analog to digital converter (ADC) 860 is coupled to the output 130 of the amplifier 115 and is configured to sense the voltage supplied at that output 130. By coupling the ADC via a respective digital logic block or module 870a, 870b to each of the DAC buffers, 210a, 210b it is possible to control the voltage that is then supplied to the amplifier to compensate for the voltage sensed initially at the output. This control may be advantageously coupled to either/or/both of the modules 870a, 870b depending on the required action. In this way the circuit may react to transients and can protect any additional circuitry coupled to the output 130. In effect the combination of the ADC and the digital logic module 870 provides a control loop. It will be understood by those skilled in the art that any voltage comparator or comparison function at the output operates as an ADC and that using the digital logic module functionality provides for control of the DAC buffers in a simple fashion that once calibrated is less prone to design errors and/or manufacturing variance. It will also be understood that such operation may be achieved by combining the digital functionality using, for example, synthesis tools.

Figure 9:
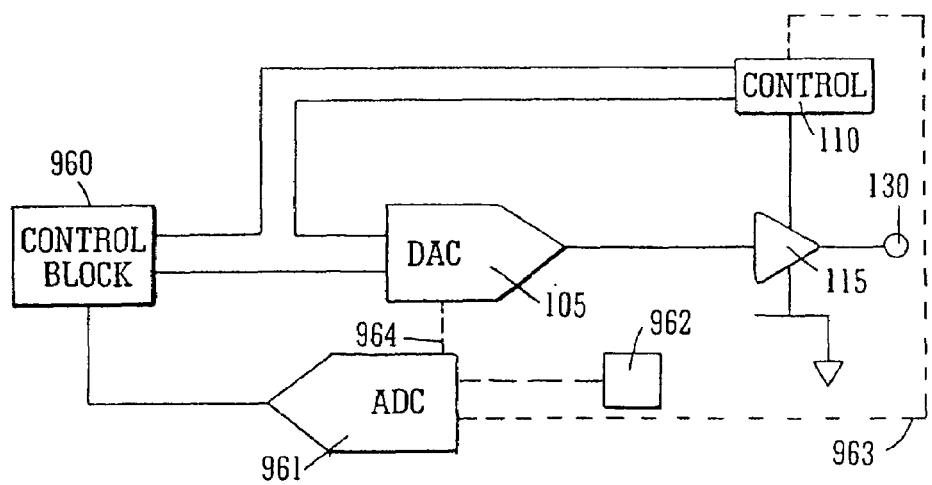
FIG. 9 shows an example of a monitoring arrangement that may be used to control the voltage output of the circuit based variations in operating parameters and conditions.

FIG. 9 shows a further modification where the architecture of FIG. 1 is supplemented with a digital control block 960 that is used to generate an appropriate control word for the DAC 105 and control circuitry 110, depending on the conditions within the circuit. For example, an on-chip PVT (pressure/voltage/temperature) sensor 962, or some other variant of a sensing device, may be provided to sense for fluctuations in the ambient operating conditions of the circuit. Any sensed variation in the load or stresses to the circuit may be sensed by the sensing device and relayed via an ADC 961 to the control block 960 where an appropriate change in control word provided to the DAC 105 and the control circuitry 110 may be used to compensate for the detected variance. It will be appreciated that by combining the functionality of the sensor 962 and the ADC 961 it is possible to achieve inherent conversion.

Figure 10:
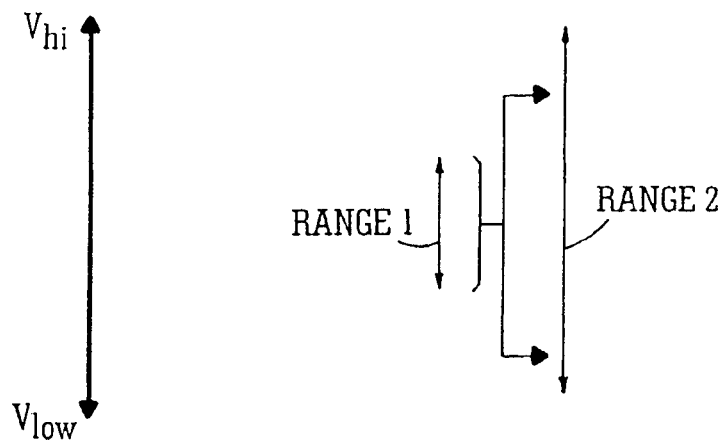
FIG. 10 shows diagrammatically an example of the overlap between the range of operation of the circuit and the range of operation of the amplifier.

FIG. 10 is a schematic showing the effect of the control of the output stage of the amplifier 115. In this schematic the actual range, Range 1, of the amplifier is slideable or moveable along an extended range, Range 2. In this way although the absolute value of the range of the amplifier does not alter, that its output range will appear to vary depending on where it is positioned on Range 2. Furthermore, depending on where Range 1 is centred, there is a large degree of potential overlap between different output ranges. For example, if the amplifier is capable of driving an output over 15V but it is desired that this range be located around 30V, it will be understood that a first range could be +/−7.5V, a second range GND (0V) to +15V (Vdd) and a third range −15V(Vss) to GND (0V). These examples illustrate the application of the teaching of the invention to multi-supply usage. The overlap that is provided could be optimally used to cater for the occurrence of abuse events or load transients. The provision of a normal operating range which is extendable above and below that operating range provides for guard bands about the actual normal range. While FIG. 10 shows two ranges (Range 1 and Range 2) it will be understood that these are provided for an understanding of the use of the circuitry of the invention and it is not intended to limit the application of the teaching of the invention to such an illustrated exemplary embodiment as two or more ranges could be provided as necessary and these could optionally be arranged such that individual ranges overlap with one another.

It will be appreciated that what has been described herein are exemplary embodiments of a voltage supply circuit that is configured to dynamically modify the operating range of the circuit depending on the requirements. By coupling an input DAC to an amplifier and then tuning the voltage supply, as a subset of an available range, to the amplifier it is possible to provide an extended range of operation of the circuit. The control of the amplifier supply voltage may be effected using switching through for example a DAC buffer that may be digitally controlled. In this way digital control of the amplifier output stage is achieved. It is possible using an architecture in accordance with the teaching of the invention to provide a plurality of voltage reference points for operation of the circuit. For example, one could select one of Vdd, Vss or ground as a reference point which has application as a power supply for bipolar devices.

Circuits provided in accordance with the teaching of the invention are useful in a plurality of applications including any industrial application that commonly uses +/−15V and +/−12V supplies and want to continue using proven solutions in their systems and yet would like to leverage off the developments provided by new technology devices.

It will be understood that by providing a control of the amplifier by varying the supply voltage to an output stage thereof desensitizes the amplifier from any fluctuations and is also advantageous in that is where the amplifier load current becomes dominant and a majority of the power is predominately consumed within the amplifier.

By tuning within the available supplies it is possible to provide an output that is either linearly or stepped moved or a combination of the two. Linearly varying is advantageous in that it is a simple configuration that contributes no additional switching noise to the electrical noise of the circuit and can be used to regulate the supply voltage directly. Switch mode regulation is a more complex configuration to implement in that it typically requires more hardware, such as inductors and the like—as will be appreciated by those skilled in the art, but is very power efficient and as such may be advantageous for certain applications. Although a switch mode configuration is typically a more noisy implementation than a linear arrangement, it will be appreciated by those skilled in the art that the advantages it offers may make it a preferred implementation for certain applications, especially where they are power sensitive for example cell phones or other handheld electronic equipment. As embodiments of the invention provide for a combination of linear and switch mode arrangements, it will be appreciated that the two could be used sequentially for example by driving the output initially with a switch-mode regulator and then using a linear regulator to achieve the desired final output. Furthermore, applications of the techniques of the invention could be found in scenarios where for example a sense signal may be used to trigger a change between a linear and switch mode of operation.

Within the context of the present invention it will be appreciated that the arrangement of regulating the output can be provided in a step down, (i.e. a buck configuration), a step up (i.e. boost regulation) or in both directions (i.e. a buck-boost) arrangement.

It will be appreciated that the word immediately when used in the context of the present invention is to specify a high speed or very quick transition and does not necessarily imply an instantaneous transition. Furthermore, the words comprises/comprising when used in this specification are to specify the presence of stated features, integers, steps or components but does not preclude the presence or addition of one or more other features, integers, steps, components or groups thereof.

Within the context of DAC architectures, it will be understood that the load power ($I_{load}*V_{drop—internal}$) is often the largest and only significant power consumption component that is not under the control of the DAC integrated circuit (IC) designer. Using an architecture in accordance with the teaching of the present invention provides an option to have higher efficiency. The DAC may be integrated with a first stage of the amplifier and made a low power component. The regulation of the amplifier power supply could be provided as a optional mode, either enabled or disabled as required. This is advantageous where the circuitry is intended for multi-use environments and in certain low power load applications, the regulation of the supply may be overridden.

Figure 11:
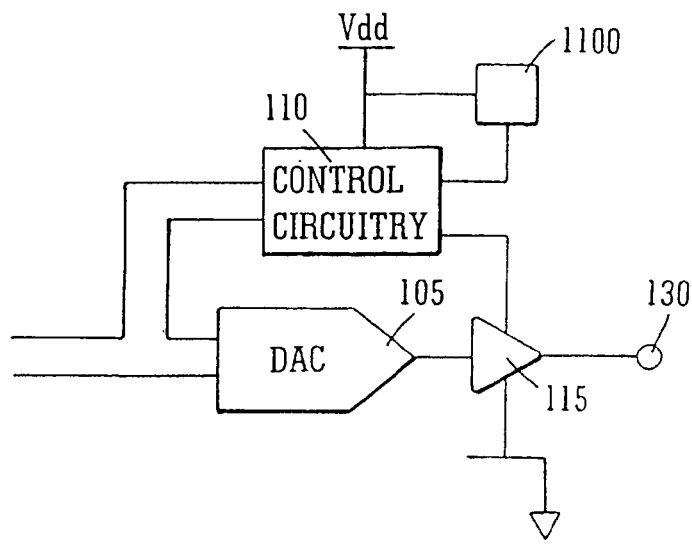
FIG. 11 shows an example of a circuit that may be used to compensate for changes or fluctuations in the power supply to the circuit.

A further application of the techniques of the invention arises in the case of auto-checking power supply levels where the regulation may be implemented when and where required and not used in "normal" operation. An example of such an arrangement is provided in FIG. 11, where a sensing device 1100 is coupled to the input positive supply, Vdd, and is configured on sensing a predetermined level of fluctuation to effect a change in the output stage power by providing an input either directly to the amplifier or in the case shown in FIG. 11 by coupling with the control circuitry 110, which then performs the necessary action to effect the change.

Figure 12:
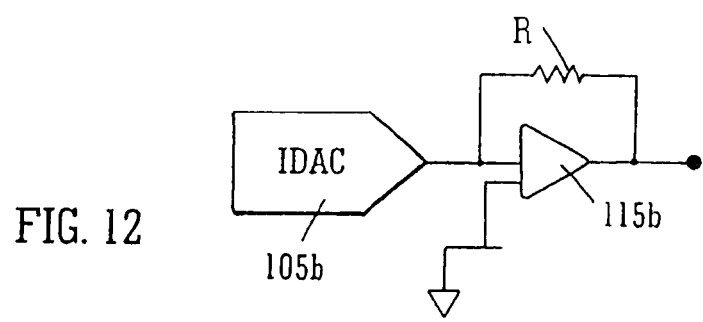
FIG. 12 shows in schematic form an example of the type of arrangement that could be used in a current mode DAC implementation.

Heretofore the configuration of the DAC 105 and amplifier 115 has been described in a voltage mode DAC configuration. It will be understood that the invention is not to be limited to such an implementation as a current mode DAC implementation such as that shown in FIG. 12 where a DAC 105*b* is coupled at its output to an amplifier 115*b* which employs a resistor, R, in a feedback loop could be equally used.

Therefore, it will be appreciated that while the invention has been described with reference to exemplary embodiments thereof, it will be appreciated that these are provided for illustrative non-limiting purposes as it is not intended to limit the invention in any way except as may be deemed necessary in the light of the appended claims. The person skilled in the art will recognise that integers or components that are described with reference to a first embodiment or figure may be equally used with those of another embodiment or figure without departing from the spirit and scope of the invention.

Furthermore where control logic or other circuitry is provided and illustrated as a distinct separate block that this is for the ease of explanation and it is possible that when implemented in an integrated circuit that the functionality of a first block may be integrated or combined with the functionality of another block. As will be appreciated by those skilled in the art that functionality described with reference to specific hardware components may be equally provided using one or more digital synthesis tools such as those known in the art to combine or "smash" such functional block boundaries to achieve the same function with minimum logic and/or at maximum speed.

What is claimed:

1. A digital to analog converter (DAC) circuit including a DAC coupled at its output to an amplifier, the circuit additionally including control circuitry digitally coupled to the input to the DAC and providing an analog output to the amplifier, the control circuitry being configured to modify a supply voltage to the amplifier based on the input to the DAC, so as to change an amplifier power supply in correspondence with changes at the DAC, and wherein the control circuitry is responsive to abuse events to effect a modification of the amplifier supply voltage.

2. The circuit as claimed in claim 1 wherein the amplifier power supply is coupled to the output stage of the amplifier.

3. The circuit as claimed in claim 2 wherein the output stage is the final stage of a multi-stage amplifier.

4. The circuit as claimed in claim 1 the control circuitry provides a digital control of the supply voltage of the amplifier.

5. The circuit as claimed in claim 4 wherein the control circuitry includes a DAC buffer.

6. The circuit as claimed in claim 5 including a first and second DAC buffer, the first and second DAC buffer controlling the positive and negative supply voltages to the amplifier respectively.

7. The circuit as claimed in claim 6 wherein the positive and negative supply voltages are the supply voltages of an output stage of the amplifier.

8. The circuit as claimed in claim 1 wherein the control circuitry is configured to provide a plurality of supply voltages within which the amplifier may be operable.

9. The circuit as claimed in claim 8 wherein the control circuitry is configured to provide at least two supply voltage ranges.

10. The circuit as claimed in claim 9 wherein the at least two voltage reference ranges have overlapping regions of operation.

11. The circuit as claimed in claim 10 wherein a first supply voltage region is located between about +15V and −5V and a second supply voltage region is located between about +5V and −15V.

12. The circuit as claimed in claim 9 wherein the control circuitry is configured to apply a suitable supply voltage to the amplifier to effect a change in its range of operation to overlap with a desired voltage region.

13. The circuit as claimed in claim 9 wherein at least two of the voltage regions overlap with ground.

14. The circuit as claimed in claim 13 wherein a first region extends from the positive supply voltage through ground to a value less than the negative supply voltage and a second region extends from a value less than the positive supply voltage through ground to the negative supply voltage.

15. The circuit as claimed in claim 14 including at least one additional region, the at least one additional region being a subset of one of the first and second regions.

16. The circuit as claimed in claim 9 wherein at least two of the voltage regions originate at ground, a first region extending in a positive range from ground and a second region extending in a negative range from ground.

17. The circuit as claimed in claim 1 being configured to dynamically change the supply voltage to the amplifier to correspond to operating requirements of the circuit such that by changing the supply voltage a corresponding change in the operating range of the amplifier is effected so as to allow the circuit output to be tuned to one or more specific voltage regions of operation.

18. The circuit as claimed in claim 1 further including a voltage comparator provided at the output of the circuit, the voltage comparator being configured to compare the voltage at the output of the circuit with a predefined target output voltage and to effect a change in the output voltage of the circuit if the comparison results in a voltage at the output being substantially different to that of the predefined target output voltage.

19. The circuit as claimed in claim 18 wherein the voltage comparator includes an analog to digital converter coupled to one or more digital control modules.

20. The circuit as claimed in claim 19 wherein the digital control modules are configured to effect a change in the operating conditions of the control circuitry so as to modify the supply voltage to the amplifier and effect a change at the output of the circuit.

21. The circuit as claimed in claim 1 wherein the control circuitry includes a switch-mode voltage regulator.

22. The circuit as claimed in claim 21 wherein the switch mode voltage regulator is provided as a buck-boost regulator.

23. The circuit as claimed in claim 22 wherein the buck-boost regulator is coupled to a DAC.

24. The circuit as claimed in claim 21 wherein the switch mode voltage regulator is provided as a buck regulator.

25. The circuit as claimed in claim 21 wherein the switch mode voltage regulator is provided as a boost regulator.

26. The circuit as claimed in claim 1 wherein the control circuitry includes a linear voltage regulator.

27. The circuit as claimed in claim 1 wherein the control circuitry includes a linear voltage regulator and a switch mode voltage regulator.

28. The circuit as claimed in claim 1 further including a sensing device provided at the output of the circuit, the sensing device being configured to detect any abuse events at the output of the circuit and on detection of an abuse event at the output of the circuit to change the supply voltage to the amplifier.

29. The circuit as claimed in claim 28 wherein the sensing device is a diode.

30. The circuit as claimed in claim 28 wherein the sensing device provides an input to the control circuitry to effect the change in the supply voltage to the amplifier.

31. The circuit as claimed in claim 1 wherein the DAC and amplifier are operable in a current mode.

32. A circuit including an amplifier, the amplifier being operable to provide an output in a first defined voltage range, the circuit being configured to operate in a second defined voltage range, the second defined voltage range being larger than the first defined voltage range, and wherein the circuit includes control circuitry coupled to an output stage of the amplifier and being configured to effect a movement of the first defined voltage range to overlap with different regions of the second defined voltage range.

33. A circuit including a DAC coupled to an amplifier, the DAC providing an output coupled to the input to the amplifier, the amplifier having a first voltage range of operation and wherein an output stage of the amplifier is coupled to control circuitry which is configured to modify the amplifier power supply so as to vary the range of the amplifier from the first voltage range of operation to a second voltage range of operation.

34. The circuit of claim 33 wherein the output stage of the amplifier is additionally coupled to the input to the DAC.

35. A digital to analog converter (DAC) circuit including a DAC coupled at its output to an amplifier, the circuit additionally including control circuitry digitally coupled to the input to the DAC and providing an analog output to the amplifier, the control circuitry being configured to modify a supply voltage to the amplifier based on the input to the DAC, so as to change an amplifier power supply in correspondence with changes at the DAC, the control circuitry including a first and second DAC buffer, the first and second DAC buffer controlling positive and negative supply voltages to the amplifier respectively.

* * * * *